US012796436B2

(12) United States Patent
Hou et al.

(10) Patent No.: US 12,796,436 B2
(45) Date of Patent: Nov. 10, 2026

(54) SEMICONDUCTOR DEVICE AND FABRICATING METHOD THEREOF

(71) Applicant: UNITED MICROELECTRONICS CORP., Hsin-Chu City (TW)

(72) Inventors: Tai-Cheng Hou, Tainan City (TW); Da-Jun Lin, Kaohsiung City (TW); Fu-Yu Tsai, Tainan City (TW); Bin-Siang Tsai, Changhua County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 425 days.

(21) Appl. No.: 18/379,668

(22) Filed: Oct. 13, 2023

(65) Prior Publication Data

US 2025/0062222 A1 Feb. 20, 2025

(30) Foreign Application Priority Data

Aug. 15, 2023 (TW) ................................ 112130613

(51) Int. Cl.
*H10W 20/42* (2026.01)
*H10W 20/00* (2026.01)

(52) U.S. Cl.
CPC ......... *H10W 20/42* (2026.01); *H10W 20/056* (2026.01); *H10W 20/074* (2026.01); *H10W 20/081* (2026.01)

(58) Field of Classification Search
CPC ........... H01L 23/5226; H01L 21/76802; H01L 21/76829; H10W 20/42; H10W 20/056; H10W 20/074; H10W 20/081; H10W 20/077; H10W 20/075; H10W 20/47; H10W 20/0698
See application file for complete search history.

(56) References Cited

U.S. PATENT DOCUMENTS 9,842,804 B2 * 12/2017 Wang ................ H01L 23/53295
2012/0121823 A1 * 5/2012 Chhabra .................. C23C 8/10 427/585
2015/0155234 A1 * 6/2015 Shih .................... H01L 23/5226 438/666
2017/0018458 A1 * 1/2017 Cheng ............... H01L 21/02063
2021/0035800 A1 * 2/2021 Liu ................... H01L 21/76832

* cited by examiner

*Primary Examiner* — Ratisha Mehta
(74) *Attorney, Agent, or Firm* — Winston Hsu

(57) ABSTRACT

The present disclosure is related to a semiconductor device and a fabricating method thereof, and the semiconductor device includes a first dielectric layer and a first conductive structure. The first dielectric layer includes a stacked structure including a low-k dielectric layer, an etching stop layer, and a carbon-rich dielectric layer between the low-k dielectric layer and the etching stop layer, wherein a carbon concentration within the carbon-rich dielectric layer is above 15%. The first conductive structure is disposed in the first dielectric layer.

16 Claims, 4 Drawing Sheets

SEMICONDUCTOR DEVICE AND FABRICATING METHOD THEREOF

BACKGROUND OF THE INVENTION

1. Field of the Invention

The present disclosure relates generally to a semiconductor device and a method of fabricating the same, and more particularly to a semiconductor device including a dielectric layer, and a method of fabricating the same.

2. Description of the Prior Art

An integrated circuit (IC) is constructed by various active components and interconnection structures formed on a substrate or in different films. Generally speaking, the fabrication of the interconnection structures is firstly carried out by etching a dielectric layer to form a through hole or a circuit pattern in the dielectric layer, and filling in the through hole or the circuit pattern with a conductive material such as copper following by planarizing the conductive material. In the back-end processes of the semiconductor devices, the frequent use of plasma easily leads to accumulation of redundant charges on the conductive material filled in the through hole or the circuit pattern, and the excessive charges often results in unnecessary currents which may enters the circuit from the conductive material, penetrates the gate oxide and leads to a threshold voltage shift. The aforementioned issues will damage to the components in the front-end process, referring to a plasma induced damage (PID) caused by Antenna effect.

In the advanced semiconductor industry, as the continuously shrinking dimension and the continuously increasing integration, the operation performance of semiconductor devices is deeply affected by the Antenna effect. Accordingly, the layout of the circuit is requested to meet the appropriate Antenna ratio (AR), that is, the ratio between the exposed area of the metal wire and the area of the gate dielectric layer. The semiconductor device is less affected by the Antenna effect if the AR is smaller, and the yield and reliability of the semiconductor device may be probably improved thereby. However, the existing AR limitation leads to the increasing difficulty and complexity of the circuit design and manufacturing process, there is still a certain chance that the current will concentrate on the transistor with smaller resistance when using the improved design such as transistor parallel connection, which still cannot effectively solve the problems caused by Antenna effect. Therefore, the improvement of the existing technology is still a crucial subject to people in the related arts.

SUMMARY OF THE INVENTION

An object of the present disclosure is to provide a semiconductor device and a method of fabricating the same, where a carbon-rich dielectric layer is additionally disposed within a dielectric layer, to dramatically improve the Antenna effect under an increasing Antenna ratio (AR). Through these manners, the semiconductor device of the present disclosure is allowable to achieve a better reliability and yield, thereby gaining an optimized operating performance.

To achieve the aforementioned objects, the present disclosure provides a semiconductor device including a first dielectric layer and a first conductive structure. The first dielectric includes a stacked structure having a low-k dielectric layer, an etching stop layer, and a carbon-rich dielectric layer between the low-k dielectric layer and the etching stop layer, wherein a carbon concentration within the carbon-rich dielectric layer is above 15%. The first conductive structure is disposed in the first dielectric layer.

To achieve the aforementioned objects, the present disclosure provides a method of fabricating a semiconductor device including the following steps. Firstly, a first dielectric layer is formed, and the first dielectric layer includes a stacked structure having a low-k dielectric layer, an etching stop layer, and a carbon-rich dielectric layer between the low-k dielectric layer and the etching stop layer, wherein a carbon concentration within the carbon-rich dielectric layer is above 15%. Next, a first conductive structure is formed in the first dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 to FIG. 4 illustrates schematic diagrams of a method of fabricating a semiconductor device according to a first embodiment of the present disclosure, in which;

FIG. 2 is a schematic cross-sectional view of a semiconductor device after forming a dielectric layer;

FIG. 3 is a schematic cross-sectional view of a semiconductor device after forming a through hole; and FIG. 4 is a schematic cross-sectional view of a semiconductor device after forming a conductive layer.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
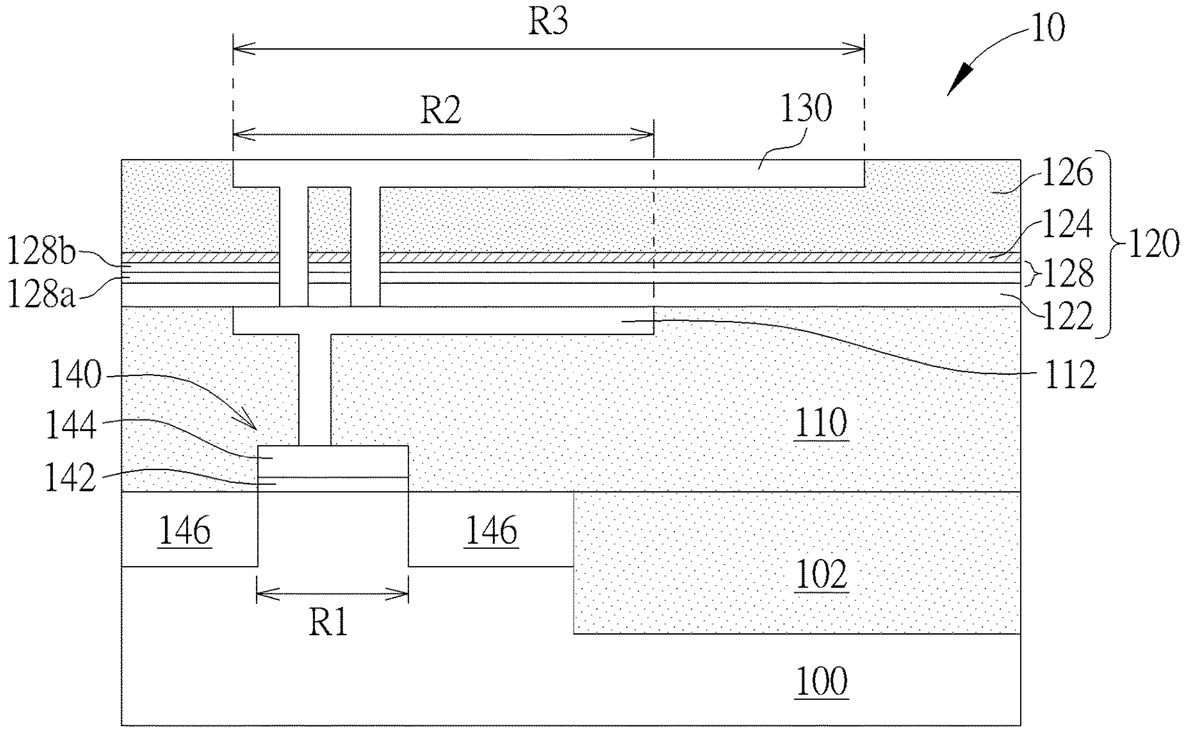
FIG. 1 illustrates a schematic diagram of a cross-sectional view of a semiconductor device according to a first embodiment of the present disclosure.

Please refer to FIG. 1, which illustrates a semiconductor device 10 according to a first embodiment of the present disclosure. The semiconductor device 10 includes a first dielectric layer 120 and a first conductive structure 130. The first conductive structure 130 is disposed within the first dielectric layer 120, for example including any components being made of a conductive material like a conductive line, a plug, a metal line or a redistribution layer (RDL), but is not limited thereto. The first dielectric layer 120 further includes a stacked structure including an etching stop layer 122, a low-k dielectric layer 126, and a carbon-rich dielectric layer 124 between the etching stop layer 122 and a low-k dielectric layer 126. It is noted that, a carbon concentration of the carbon-rich dielectric layer 124 is above 15%. Through these arrangements, the carbon-rich dielectric layer 124 is disposed in the middle of the stacked structure of the first dielectric layer 120, with the carbon-rich dielectric layer 124 being not directly contact the top surface or the bottom surface of the first dielectric layer 120, to neutralize the free radicals and charged substances (including ions and electrons) which are possibly accumulated on the first conductive structure 130, thereby reducing the structural damages to the semiconductor device 10 caused by plasma used in the back-end process, and further avoiding the Antenna effect.

Precisely speaking, the carbon concentration of the carbon-rich dielectric layer 124 is in the range from 15% to 90%, and preferable being 15% to 50%, but is not limited thereto. While forming the carbon-rich dielectric layer 124, a relative higher carbon concentration is positively correlated to a relative greater precursor generated accordingly at the same time, and then, which enables to have a stronger ability to neutralize unstable charges and to achieve a better function in stabilizing charges. The carbon-rich dielectric layer 124 includes a greater carbon concentration than that of the low-k dielectric layer 126, for example being about 3% to 10% greater than that of the low-k dielectric layer 126, and preferably being about 5% greater than that of the low-k dielectric layer 126, but is not limited thereto. In one embodiment, the low-k dielectric layer 126 for example includes a dielectric material having a dielectric constant lower than 3, and preferably lower than 2.5 to 2.9, like fluorinated silica glass (FSG), silicon carbide oxide (SiCOH), porous carbon oxide or spin-coated silicon glass, but is not limited thereto. In another embodiment, the carbon-rich dielectric layer 124 for example includes a dielectric material having a dielectric constant lower than that of the low-k dielectric layer 126, preferably includes a dielectric material having a dielectric constant lower than 2.5, and more preferably lower than 2 to 2.4, like a carbon-rich organic component such as terpinene, but is not limited to. The etching stop layer 122 for example includes a dielectric material having a dielectric constant greater than that of the low-k dielectric layer 126, like nitrogen doped carbide, but not limited thereto.

In the present embodiment, the etching stop layer 122, the carbon-rich dielectric layer 124, and the low-k dielectric layer 126 are for example stacked sequentially from bottom to top on the substrate 100, as shown in FIG. 1. The substrate 100 for example includes a silicon substrate, a silicon-containing substrate (for example including silicon carbide or silicon germanium), or silicon-on-insulator substrate, and at least one shallow trench isolation 102 is disposed in the substrate 100, to surround and to define a plurality of active areas (not shown in the drawings) in the substrate 100, but is not limited thereto. Furthermore, the stacked structure of the first dielectric layer 120 may optionally include an adhesive layer 128 between the etching stop layer 122 and the carbon-rich dielectric layer 124, to strengthen the combination of the etching stop layer 122 and the carbon-rich dielectric layer 124, to avoid the peeling films. In one embodiment, the adhesive layer 128 for example includes an initiation layer 128*a* and a transition layer 128*b* stacked sequentially between the etching stop layer 122 and the carbon-rich dielectric layer 124, wherein the initiation layer 128*a* and the transition layer 128*b* respectively includes a dielectric material of carbon, oxygen, hydrogen or silicon, but is not limited thereto.

Further in view of FIG. 1, the semiconductor device 10 further includes a dielectric layer 110 and a gate structure 140 between the first dielectric layer 120 and the substrate 100. The gate structure 140 is disposed on the substrate 100, to further include a gate dielectric layer 142 and a gate electrode 144 stacked sequentially on a top surface of the substrate 100, and two source/drain electrodes 146 disposed within the substrate 100. The dielectric layer 110 further includes a plug 112 disposed therein to electrically connect the gate structure 140 underneath, and the first conductive structure 130. With these arrangements, the dielectric layer 110 is configured as an interlayer dielectric layer (ILD) of the semiconductor device 10 when the plug 112 serving as a contact plug or a zero-layer metal interconnection (M0) of the semiconductor device 10, and the first dielectric layer 120 is configured as an inter-metal dielectric layer (IMD) of the semiconductor device 10 when the first conductive structure 130 serving as a first-layer metal interconnection (M1). It is noted that, the aforementioned dielectric layers and the interconnections are sequentially disposed over the gate structure 140, such that, the gate structure 140 may enable to be electrically connected to other active elements and/or passive elements through other connections, thereby achieving the required performances.

According to the semiconductor device 10 of the present embodiment, as the carbon-rich dielectric layer 124 is disposed within the inter-metal dielectric layer (namely the first dielectric layer 120), with the precursors in the carbon-rich dielectric layer 124 neutralizing the free radicals and the charged substances generated in the back-end process or in the etching process, the unstable charges will not be accumulated on the metal interconnection such as the first conductive structure 130, thereby effectively reducing the possibility of structural damages caused by plasma used in the back-end process. In this way, the semiconductor device 10 of the present embodiment enables to improve the Antenna effect, and the Antenna ratio (AR) of the semiconductor device 10 is no longer requested to meet the existing AR limitation like AR2000, wherein the AR referring to a ratio between an exposing area of the metal wires to a surface area of the gate dielectric layer 142. The smaller AR results in fewer influences by the Antenna effect. For example, in the semiconductor device 10 of the present embodiment, a ratio (R2+R3/R1) between the sum of a surface area R2 of the plug 112 and a surface area R3 of the first concoctive structure 130 to a surface area R1 of the gate electrode 144 (or the gate dielectric layer 142) reaches to more than AR5000, and less than AR100000, preferably between AR5000 and AR100000, but not limited thereto. In addition, a ratio (R2/R1) between the surface area R2 of the first conductive structure 130 to the surface area R1 of the gate electrode 144 (or the gate dielectric layer 142) may also reach to more than AR5000, and less than AR100000, preferably between AR5000 and AR100000. Accordingly, the semiconductor device 10 of the present embodiment is allowable to gain improved reliability and yield, to achieve better functions and performances.

In order to make people skilled in the art of the present disclosure easily understand the semiconductor device 10 of the present disclosure, the fabricating method of the semiconductor device 10 in the present disclosure will be further described below.

Figure 2:
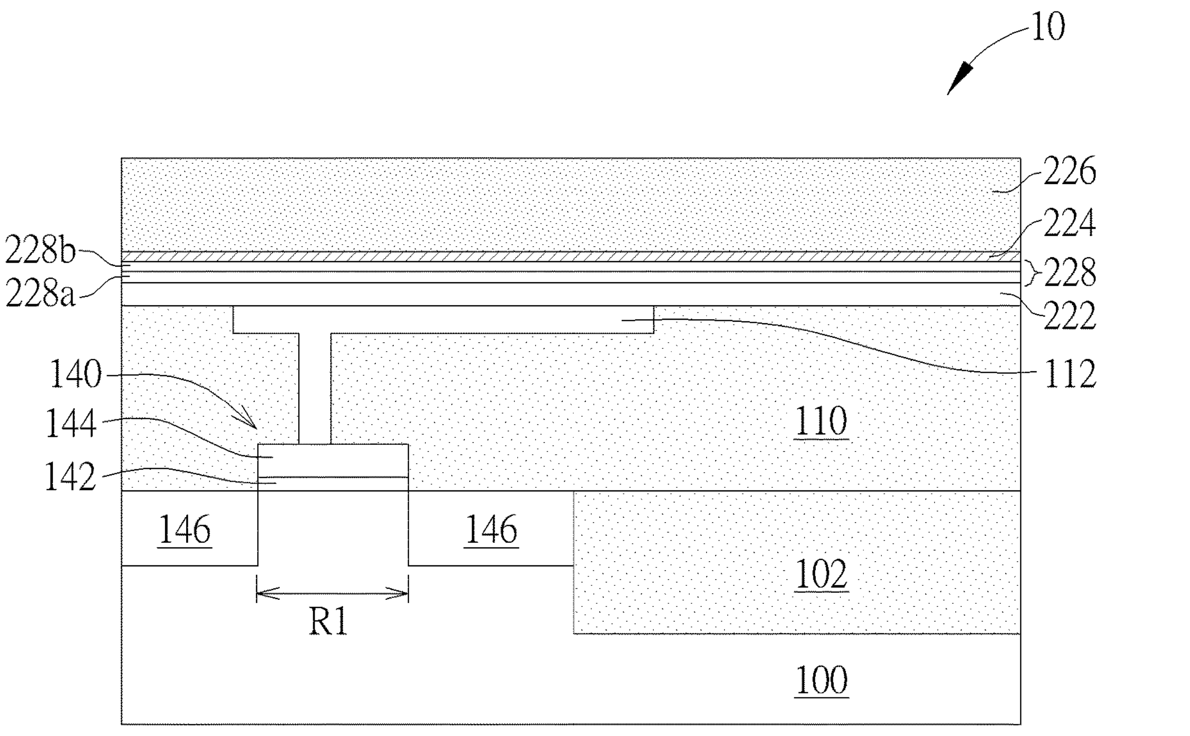
Figure 4:
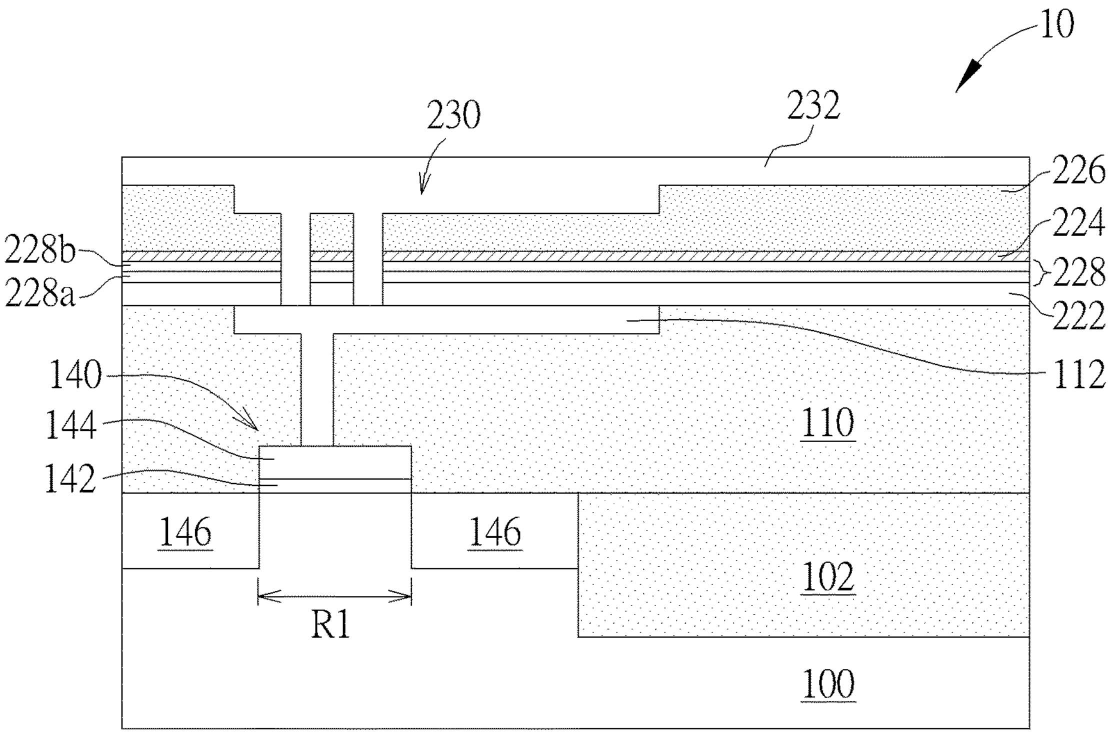

Please refer to FIG. 2 and FIG. 4, illustrating schematic diagrams of a fabricating method of the semiconductor device 10 according to the first embodiment in the present disclosure. Firstly, as shown in FIG. 2, the substrate 100 is provided, the shallow trench isolation 102 is formed in the substrate 100, and the gate structure 140 is partially formed on the substrate 100 and is partially formed in the substrate 100. Next, the dielectric layer 110 and the plug 112 are formed on the substrate 100 and the gate structure 140.

As shown in FIG. 2, an etching stop material layer 222, a carbon-rich dielectric material layer 224, and a low-k dielectric material layer 226 are sequentially formed on the dielectric layer 110 and the plug 112, with the carbon-rich dielectric material layer 224 having the carbon concentration higher than 15%, for example about 15%-90%, and preferably about 15%-50%, and with the carbon-rich dielectric material layer 224 having the higher carbon concentration than that of the low-k dielectric material layer 222, for example being more than 3%-10% higher, and preferably more than about 5% higher, but not limited thereto. In one embodiment, the low-k dielectric material layer 226 for example includes a dielectric material having a dielectric constant lower than 3, and preferably includes a dielectric material having a dielectric constant lower than 2.5 to 2.9 like FSG, SiCOH, porous carbon oxide or spin-coated silicon glass, the carbon-rich dielectric material layer 224 for example includes a dielectric material having a dielectric constant lower than that of the low-k dielectric material layer 226, preferably includes a dielectric material having a dielectric constant lower than 2.5, and more preferably lower than 2 to 2.4 like a carbon-rich organic component such as terpinene, and the etching stop material layer 222 for example includes a dielectric material having a dielectric constant greater than that of the low-k dielectric material layer 226 like nitrogen doped carbide, but not limited to be the aforementioned materials. In one embodiment, an adhesive material layer 228 may be optionally formed between the etching stop material layer 222 and the carbon-rich dielectric material layer 224, to strengthen the combination of the etching stop material layer 222 and the carbon-rich dielectric material layer 224. The adhesive material layer 228 for example includes an initiation material layer **228*a* and a transition material layer 228*b* stacked sequentially between the etching stop material layer 222 and the carbon-rich dielectric material layer 224, wherein the initiation material layer 228*a* and the transition material layer 228*b*** respectively includes a dielectric material consisted of carbon, oxygen, hydrogen or silicon, but is not limited thereto.

Figure 3:
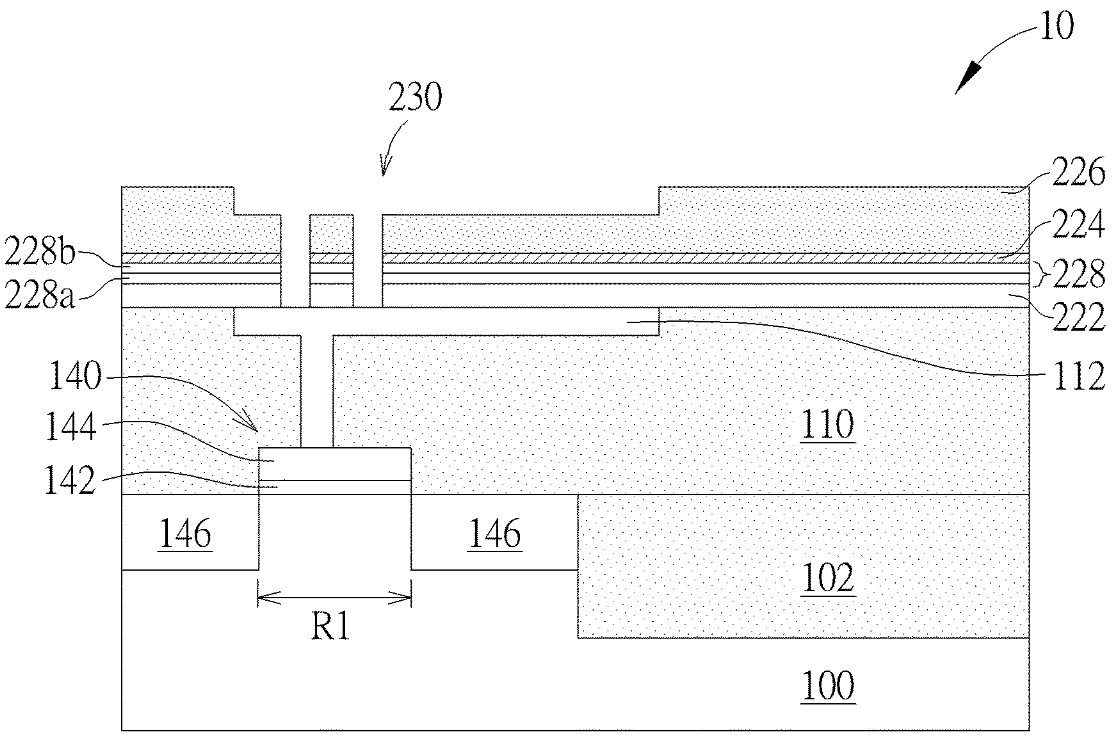

As shown in FIG. 3, an etching process such as a dry etching process with plasma is performed through a mask layer (not shown in the drawings). The etching process is performed by using the etching stop material layer 222 as an etching blocker, and sequentially etching the low-k dielectric material layer 226, the carbon-rich dielectric material layer 224, and the etching strop material layer 222, to form at least one through hole 230 in the low-k dielectric material layer 226, the carbon-rich dielectric material layer 224 and the etching stop material layer 222. Then, a portion of the top surface of the plug 112 is exposed from the bottom of the through hole, and the mask layer is completely removed.

As shown in FIG. 4, a deposition process is performed, and a conductive material 232 is formed to fill in the through hole 230 and to further cover on the top surface of the low-k dielectric material layer 226. In one embodiment, the conductive material 232 for example includes a barrier layer (not shown in the drawings) formed on sidewalls of the through hole 230 and the top surface of the low-k dielectric material layer 226, and a metal layer (not shown in the drawings) filled up the through hole 230 and covering on the barrier layer, but not limited thereto. In other words, the conductive material 232 is partially formed in the through hole 230 and is partially formed outside the through hole 230. After that, a planarization process is performed, to remove the conductive material 232 outside the through hole 230, thereby forming the first conductive structure 130 as shown in FIG. 1, and simultaneously forming the low-k dielectric layer 126, the carbon-rich dielectric layer 124 having above 15% carbon concentration, and the etching stop layer 122 stacked sequentially to form the first dielectric layer 120 also shown in FIG. 1. Accordingly, the first conductive structure 130 is formed in the first dielectric layer 120.

People well known in the arts should easily realize the semiconductor device and the fabricating method thereof in the present disclosure are not limited to the aforementioned embodiment, and may further include other examples. The following description will detail the different embodiments of the semiconductor device and the fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 5:
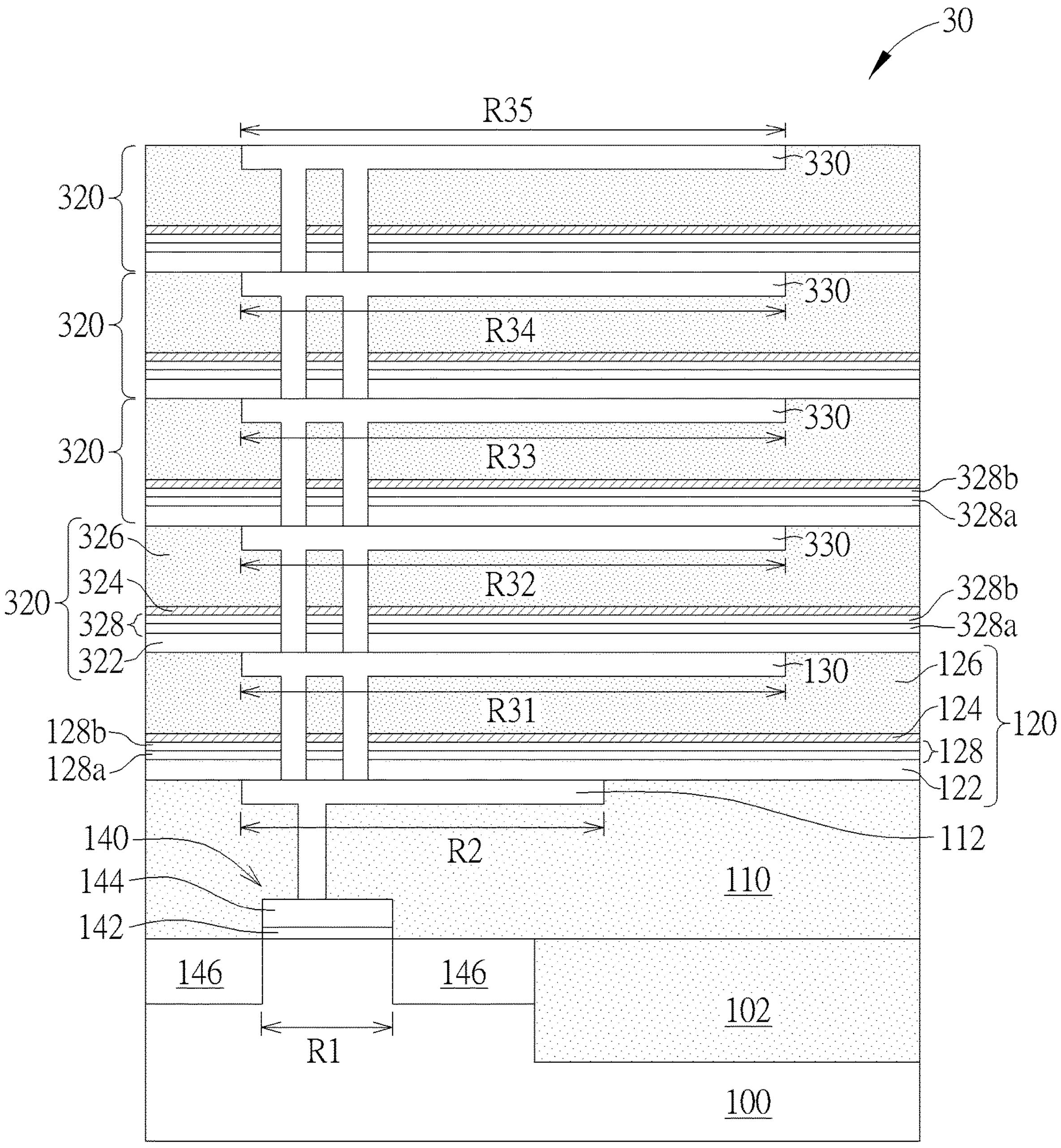
FIG. 5 illustrates a schematic diagram of a cross-sectional view of a semiconductor device according to a second embodiment of the present disclosure.

Please refer to FIG. 5, which illustrates a semiconductor device 30 according to a second embodiment of the present disclosure. The structure of the semiconductor device 30 of the present embodiment is substantially the same as that of the aforementioned first embodiment, and all the similarities of the two embodiments will not be redundantly described hereinafter. The difference between the present embodiment and the aforementioned first embodiment is mainly in that the semiconductor device 30 additionally includes a plurality of second dielectric layers 320 and a plurality of second conductive structures 330 on the first dielectric layer 120, with each of the second conductive structures 330 respectively disposed within each of the second dielectric layers 320.

Precisely speaking, each of the second conductive structures 330 for example includes any components being made of a conductive material such as a conductive line, a plug, a metal line or a RDL, but is not limited thereto. Each of the second dielectric layers 320 respectively includes an etching stop layer 322, a carbon-rich dielectric layer 324, and a low-k dielectric layer 326 stacked sequentially, wherein the carbon-rich dielectric layer 324 has the carbon concentration above 15%, for example in the range of about 15%-90%, and preferably about 15%-50%, but not limited thereto. It is noted that, the carbon-rich dielectric layer 324 includes a greater carbon concentration than that of t the low-k dielectric layer 326, for example being about 3% to 10% greater, and preferably being about 5% greater, but is not limited thereto. In addition, each of the second dielectric layer 320 may also include an adhesive layer 328 optionally disposed between the etching stop layer 322 and the carbon-rich dielectric layer 324, to strengthen the combination of the etching stop layer 322 and the carbon-rich dielectric layer 324, thereby avoiding peeling films or structural collapse. In one embodiment, the adhesive layer 328 for example includes an initiation layer **328*a* and a transition layer 328*b* stacked sequentially from bottom to top, with the initiation layer 328*a* and the transition layer 328*b*** respectively including a dielectric material containing carbon, oxygen, hydrogen or silicon, but not limited thereto.

People skilled in the arts should easily realize the practical number of the second dielectric layers 320 and/or the precise pattern or the surface area R31, R32, R33, R34, R35 of the second conductive structures 330 in the present embodiment are only for exemplified, and which may be further adjusted based on practical product requirements and will not be limited by what is shown in FIG. 5. For example, in another embodiment, one layer, two layers, or multilayer of the second dielectric layers 320 can be formed on the first dielectric layer 110, with each of the second dielectric layers 320 having the carbon-rich dielectric layer 324 disposed therein, and with each of the second conductive structures 330 disposed within each of the second dielectric layers 320 having various surface areas R32, R33, R34, R35 or various required patterns. Also, other features like material selections and the dielectric constant of the etching stop layer 322, the carbon-rich dielectric layer 324, and the low-k dielectric layer 326 of the present embodiment are all substantially the same as those of the etching stop layer 122, the carbon-rich dielectric layer 124, and the low-k dielectric layer 126 of the aforementioned first embodiment, and those will not be redundantly described hereinafter.

With these arrangements, the dielectric layer 110 is also configured as an ILD layer of the semiconductor device 30 when the plug 112 serving as a contact plug or an zero-layer metal interconnection of the semiconductor device 30, and the first dielectric layer 120 and each second dielectric layer 320 are respectively configured as an IMD layer of the semiconductor device 30 when the first conductive structure 130 serving as a M1 metal interconnection and the second conductive structures 330 sequentially serving as a second-layer metal interconnection (M2), a third-layer metal interconnection (M3) to a $n_{th}$-layer metal interconnection (with n being a positive integer greater than 3). Accordingly, through arranging the carbon-rich dielectric layers 124, 324 inside each IMD layer of the semiconductor device 30, the semiconductor device 30 of the present embodiment enables not only to neutralize the free radicals and charged substances generated by the deposition process or the etching process at the back-end process, but also to prevent unstable charges from accumulating on each of the metal interconnections (such as the first conductive structure 130 and the second conductive structures 330), thereby increasing the tolerance of the semiconductor device 30 against to the Antenna effect, and further reducing the possibility to get structural damage caused by plasma in the back-end process in a more efficiency manner.

In this way, the semiconductor device 30 of the present embodiment is also allowable to gain a dramatically improved reliability and yield, and which is no longer required to meet the existing AR limitation like AR2000, wherein, a ratio ((R2+R31+R32+R33+R34+R35)/R1) between the sum (R2+R31+R32+R33+R34+R35) of the surface area R2 of the plug 112 and the surface areas (R31+R32+R33+R34+R35) of all of the metal interconnections to the surface area R1 of the gate electrode 144 (or the gate dielectric layer 142) reaches to more than AR5000, and less than AR100000, preferably between AR5000 and AR100000, but not limited thereto.

Figure 6:
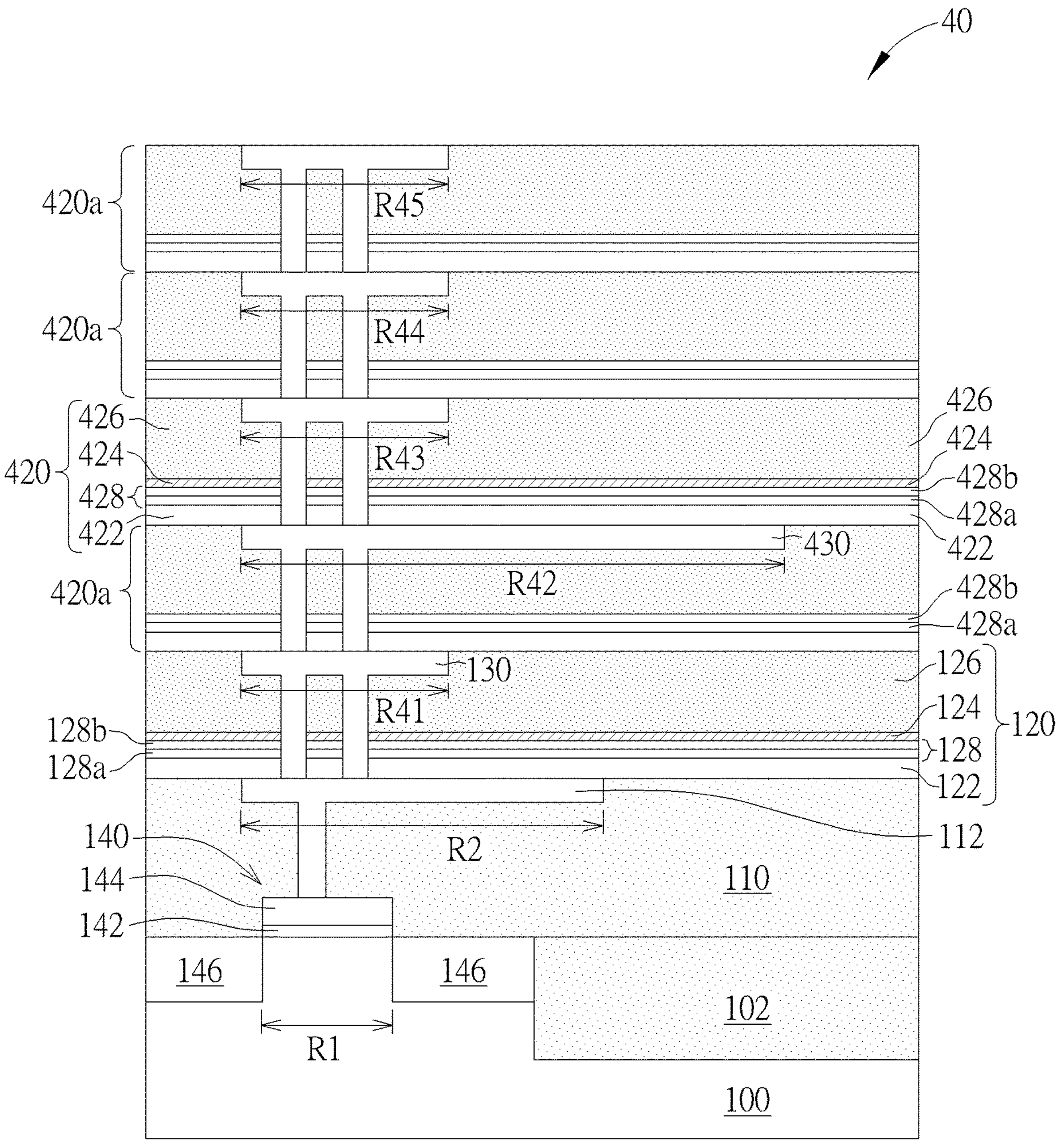
FIG. 6 illustrates a schematic diagram of a cross-sectional view of a semiconductor device according to a third embodiment of the present disclosure.

Please refer to FIG. 6, which illustrates a semiconductor device 40 according to a third embodiment of the present disclosure. The structure of the semiconductor device 40 of the present embodiment is substantially the same as that of the aforementioned first embodiment, and all the similarities of the two embodiments will not be redundantly described hereinafter. The difference between the present embodiment and the aforementioned first embodiment is mainly in that the semiconductor device 40 additionally includes a plurality of second dielectric layers 420, 420*a* and a plurality of second conductive structures 430 on the first dielectric layer 120, with each of the second conductive structures 430 respectively disposed within each of the second dielectric layers 420, 420*a*.

Precisely speaking, each of the second conductive structures 430 for example includes any components being made of a conductive material like a conductive line, a plug, a metal line or a RDL, but is not limited thereto. Each of the second dielectric layers 420, 420*a* respectively includes an etching stop layer 422, an adhesive layer 428 and a low-k dielectric layer 426 stacked sequentially. In one embodiment, the adhesive layer 428 for example includes an initiation layer 328*a* and a transition layer 328*b* stacked sequentially from bottom to top, or the adhesive layer 428 may also be omitted, but not limited thereto. It is noted that, a carbon-rich dielectric layer 424 is additionally disposed within at least one of the second dielectric layers 420, and preferably disposed in the second dielectric layer 420 over the second conductive structure 430 with a relative greater surface area R42, wherein the surface area R42 of the second conductive structure 430 is for example greater than the surface area R2 of the first conductive structure 130, but not limited thereto. In other words, there is no carbon-rich dielectric layer disposed within other second dielectric layers 420*a*. Otherwise, in another embodiment, the carbon-rich dielectric layer 124 disposed within the first dielectric layer 120 may also be omitted, to only remain the carbon-rich dielectric layer 424 in the dielectric layer (for example the second dielectric layer 420) on the metal interconnection (for example the second conductive structure 430) with a relative greatest surface area.

The carbon-rich dielectric layer 424 is precisely disposed between the etching stop layer 422 and the low-k dielectric layer 426, over the adhesive layer 428. The carbon-rich dielectric layer 424 includes a carbon concentration in above 15%, for example in the range of about 15%-90%, and preferably about 15%-50%, and the carbon-rich dielectric layer 424 includes a greater carbon concentration than that of the low-k dielectric layer 426, for example being about 3% to 10% greater, and preferably being about 5% greater, but is not limited thereto. In one embodiment, while the surface area R42 of the second conductive structure 430 is larger than the surface area R2 of the first conductive structure 130, the carbon concentration of the carbon-rich dielectric layer 424 within the second dielectric layer 420 surrounding the aforementioned second conductive structure 430 is preferably higher than the carbon concentration of the carbon-rich dielectric layer 124 within the first dielectric layer 120, but not limited thereto.

People well skilled in the arts should easily realize the practical number of the second dielectric layers 420, 420*a* and/or the precise pattern or the surface area R41, R42, R43, R44, R45 of the second conductive structure 430 in the present embodiment are only for exemplified, and which may be further adjusted based on practical product requirements and will not be limited by what is shown in FIG. 6. Also, other features like material selections and the dielectric constant of the etching stop layer 422, the carbon-rich dielectric layer 424, and the low-k dielectric layer 426 of the present embodiment are all substantially the same as those of the etching stop layer 122, the carbon-rich dielectric layer 124, and the low-k dielectric layer 126 of the aforementioned first embodiment, and those will not be redundantly described hereinafter.

With these arrangements, the dielectric layer 110 is also configured as an ILD layer of the semiconductor device 40 when the plug 112 serving as a contact plug or an zero-layer metal interconnection of the semiconductor device 40, and the first dielectric layer 120 and each second dielectric layer 420, 420*a* are respectively configured as an IMD layer of the semiconductor device 40 when the first conductive structure 130 serving as a M1 metal interconnection and each second conductive structure 430 sequentially serving as a M2 metal interconnection, a M3 metal interconnection to a $M_{th}$-layer metal interconnection (with M being a positive integer greater than 4). Accordingly, through arranging the carbon-rich dielectric layers 124, 424 inside at least one IMD layer (such as the first dielectric layer 120 and/or the second dielectric layer 420) of the semiconductor device 40, preferably in an IMD dielectric layer on the metal interconnection with a relative greater surface area, for neutralizing the free radicals and charged substances generated by the deposition process or the etching process at the back-end process, and also, for preventing the unstable charges from accumulating on each of the metal interconnections (such as the first conductive structure 130 and/or the second conductive structures 430). Then, the tolerance of the semiconductor device 40 against to the Antenna effect will be dramatically increased, and also the possibility to get structural damage caused by plasma in the back-end process will be further reduced in a more efficiency manner.

In this way, the semiconductor device 40 of the present embodiment is also allowable to gain a dramatically improved reliability and yield, and which is no longer to meet the existing AR limitation like AR2000, wherein, a ratio ((R2+R41+R42+R43+R44+R45)/R1) between the sum (R2+R41+R42+R43+R44+R45) of the surface area R2 of the plug 112 and surface areas (R41+R42+R43+R44+R45) of all of the metal interconnections to the surface area R1 of the gate electrode 144 (or the gate dielectric layer 142) reaches to more than AR5000, and less than AR100000, preferably between AR5000 and AR100000, but not limited thereto.

Overall speaking, according to the semiconductor device and the fabricating method thereof, a carbon-rich dielectric layer having a carbon concentration above 15% and a dielectric constant lower than 2.5 is arranged in at least one IMD layer, and preferably disposed inside the IMD layer on the metal interconnection having the relative greater surface area, or disposed inside each IMD layer, to neutralize the free radicals and charged substances generated by the back-end process (for example the deposition process or the etching process), and to prevent unstable charges from accumulating on the metal interconnection, thereby dramatically reducing the possibility to get structural damage caused by plasma in the back-end process. Thus, the semiconductor device of the present disclosure enables to dramatically improve the Antenna effect under an increasing AR, and also, to gain an optimized reliability and yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:

a first dielectric layer, the first dielectric layer comprises a stacked structure comprising a low-k dielectric layer, an etching stop layer, and a carbon-rich dielectric layer between the low-k dielectric layer and the etching stop layer, wherein a carbon concentration within the carbon-rich dielectric layer is above 15%, the low-k dielectric layer comprises a dielectric constant, and the carbon-rich dielectric layer comprises a dielectric constant lower than the dielectric constant of the low-k dielectric layer;

a first conductive structure, disposed in the first dielectric layer; and a gate electrode, disposed under the first dielectric layer, wherein a ratio between a surface area of the first conductive structure and a surface area of the gate electrode is greater than AR5000 and is less than AR100000.

2. The semiconductor device according to claim 1, wherein the etching stop layer comprises nitrogen doped carbide.

3. The semiconductor device according to claim 1, wherein the dielectric constant of the low-k dielectric layer is between 2.5 and 2.9.

4. The semiconductor device according to claim 3, wherein the etching stop layer comprises a dielectric constant greater than the dielectric constant of the low-k dielectric layer.

5. The semiconductor device according to claim 1, wherein the carbon concentration within the carbon-rich dielectric layer is 3%-10% greater than a carbon concentration within the low-k dielectric layer.

6. The semiconductor device according to claim 1, wherein the stacked structure further comprises an adhesive layer.

7. The semiconductor device according to claim 6, wherein the adhesion layer further comprises an initiation layer and a transition layer stacked sequentially between the etching stop layer and the carbon-rich dielectric layer.

8. The semiconductor device according to claim 7, wherein the initiation layer or the transition layer comprises carbon, oxygen, hydrogen or silicon.

9. The semiconductor device according to claim 1, further comprising:

a plurality of second dielectric layers stacked on one over another on the first dielectric layer; and a plurality of second conductive structures, respectively disposed in the plurality of second dielectric layers, wherein at least one of the plurality of second dielectric layers comprises another carbon-rich dielectric layer disposed therein, and a carbon concentration of the another carbon-rich dielectric layer is above 15%.

10. The semiconductor device according to claim 1, further comprising:

a plurality of second dielectric layers stacked on one over another on the first dielectric layer; and a plurality of second conductive structures, respectively disposed in the plurality of second dielectric layers, wherein each of the plurality of second dielectric layers comprises another carbon-rich dielectric layer disposed therein, and a carbon concentration of the another carbon-rich dielectric layer is above 15%.

11. The semiconductor device according to claim 9, wherein a surface area of one of the second conductive structures is greater than a surface area of the first conductive structure, and the another carbon-rich dielectric layer is disposed on the one of the second conductive structures.

12. A method of fabricating a semiconductor device, comprising:

forming a gate electrode on a substrate;

forming a first dielectric layer on the gate electrode, wherein the first dielectric layer comprises a stacked structure comprising a low-k dielectric layer, an etching stop layer, and a carbon-rich dielectric layer between the low-k dielectric layer and the etching stop layer, wherein a carbon concentration within the carbon-rich dielectric layer is above 15%, the low-k dielectric layer comprises a dielectric constant, and the carbon-rich dielectric layer comprises a dielectric constant lower than the dielectric constant of the low-k dielectric layer; and forming a first conductive structure in the first dielectric layer, wherein the gate electrode is disposed under the first dielectric layer, and a ratio between a surface area of the first conductive structure and a surface area of the gate electrode is greater than AR5000 and is less than AR100000.

13. The method of fabricating the semiconductor device according to claim 12, wherein forming the first dielectric layer further comprising:

sequentially forming an etching stop material layer, a carbon-rich dielectric material layer, and a low-k dielectric material layer; and forming an adhesive material layer between the low-k dielectric material layer and the carbon-rich dielectric material layer.

14. The method of fabricating the semiconductor device according to claim 13, wherein forming the first conductive structure further comprising:

forming a through hole in the low-k dielectric material layer, the carbon-rich dielectric material layer, and the etching stop material layer;

forming a conductive material in the through hole; and partially removing the conductive material to form the first conductive structure filled in the through hole, and to form the low-k dielectric layer, the carbon-rich dielectric layer, and the etching stop layer.

15. The method of fabricating the semiconductor device according to claim 12, further comprising:

forming a plurality of second dielectric layers stacked on one over another on the first dielectric layer; and forming a plurality of second conductive structures respectively within the plurality of second dielectric layers, wherein at least one of the plurality of second dielectric layers comprises another carbon-rich dielectric layer disposed therein, and a carbon concentration of the another carbon-rich dielectric layer is above 15%.

16. The method of fabricating the semiconductor device according to claim 12, further comprising:

forming a plurality of second dielectric layers stacked on one over another on the first dielectric layer; and forming a plurality of second conductive structures respectively within the plurality of second dielectric layers, wherein each of the plurality of second dielectric layers comprises another carbon-rich dielectric layer disposed therein, and a carbon concentration of the another carbon-rich dielectric layer is above 15% greater than that of the plurality of second dielectric layers.

* * * * *